(12) United States Patent
Yun et al.

(10) Patent No.: US 12,087,184 B2
(45) Date of Patent: Sep. 10, 2024

(54) DISPLAY DEVICE

(71) Applicant: Samsung Display Co., LTD., Yongin-si (KR)

(72) Inventors: Hae Ju Yun, Hwaseong-si (KR); Soo Hyun Moon, Hwaseong-si (KR); Jun Seok Min, Suwon-si (KR); Woo Guen Jang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/941,285

(22) Filed: Sep. 9, 2022

(65) Prior Publication Data

US 2023/0133818 A1   May 4, 2023

(30) Foreign Application Priority Data

Oct. 28, 2021   (KR) .......................... 10-2021-0145358

(51) Int. Cl.
*H05K 5/00*   (2006.01)
*G09F 9/30*   (2006.01)

(52) U.S. Cl.
CPC .......... *G09F 9/301* (2013.01); *H05K 5/0018* (2022.08); *H05K 5/0039* (2013.01); *H05K 5/0069* (2013.01)

(58) Field of Classification Search
CPC .... G06F 1/1652; G06F 1/1656; G06F 1/1686; G06F 1/1605; G06F 1/1607
See application file for complete search history.

(56) References Cited

U.S. PATENT DOCUMENTS

| | | | |
|---|---|---|---|
| 9,098,241 B1* | 8/2015 | Cho ....................... | B65H 75/28 |
| 2003/0025668 A1* | 2/2003 | Lin ........................ | G06F 3/0221 |
| | | | 345/169 |
| 2016/0187929 A1* | 6/2016 | Kim ....................... | G06F 1/1643 |
| | | | 345/184 |
| 2017/0318688 A1 | 11/2017 | Kim et al. | |
| 2019/0208650 A1 | 7/2019 | Kim et al. | |
| 2019/0326718 A1* | 10/2019 | Zhang ................... | G06F 1/1652 |
| 2020/0073444 A1* | 3/2020 | Kim ....................... | G09F 9/301 |
| 2020/0107458 A1* | 4/2020 | Park ....................... | H05K 1/142 |
| 2020/0203642 A1 | 6/2020 | Kim et al. | |
| 2020/0209924 A1* | 7/2020 | Zuo ..................... | G06F 3/04883 |

(Continued)

FOREIGN PATENT DOCUMENTS

| | | |
|---|---|---|
| GB | 2549821 | 11/2017 |
| KR | 10-2022-0027376 | 3/2022 |
| KR | 10-2022-0147187 | 11/2022 |

OTHER PUBLICATIONS

International Search Report for International Application No. EP 22203911, dated Mar. 13, 2023.

*Primary Examiner* — Sagar Shrestha
(74) *Attorney, Agent, or Firm* — KILE PARK REED & HOUTTEMAN PLLC

(57) ABSTRACT

A display device includes a display panel; a chip on film attached to an end of the display panel; a printed circuit board electrically connected to an end of the chip on film and including a connector portion; a rotation shaft including the printed circuit board and extending in a direction; and a flexible cable having an end electrically connected to the connector portion of the printed circuit board. The connector portion of the printed circuit board does not overlap the display panel in a plan view.

18 Claims, 12 Drawing Sheets

(56) References Cited

U.S. PATENT DOCUMENTS

| | | | | |
|---|---|---|---|---|
| 2021/0272484 A1* | 9/2021 | Pyo | .................. | G06F 1/1624 |
| 2021/0358346 A1* | 11/2021 | Suga | .................. | H05B 33/02 |
| 2022/0068973 A1 | 3/2022 | Yun et al. | | |
| 2022/0346249 A1* | 10/2022 | Ahn | .................. | H05K 5/0217 |
| 2022/0404873 A1* | 12/2022 | Seki | .................. | G09F 9/301 |

* cited by examiner

DISPLAY DEVICE

CROSS-REFERENCE TO RELATED APPLICATION

This application claims priority to and benefits of Korean Patent Application No. 10-2021-0145358 under 35 U.S.C. § 119, filed in the Korean Intellectual Property Office on Oct. 28, 2021, the entire contents of which are incorporated herein by reference.

BACKGROUND

1. Technical Field

The disclosure relates to a display device capable of minimizing a radius of a rotation shaft.

2. Description of Related Art

The importance of a display device to display an image has been emphasized because of the increasing developments of information technology. For example, the display device is applied to various electronic devices such as a smart phone, a digital camera, a notebook computer, a navigation system, and a smart television. The display device may be a flat panel display device such as a liquid crystal display device, a field emission display device, an organic light-emitting display device, or the like. Among the flat panel display devices, the light emitting display device includes light-emitting elements in which each pixel of a display panel may emit light independently of a separate light source, and thus may display an image without a light emitting part providing light to the display panel.

Further, users of a flexible display device has been increasing and becoming more popular. The flexible display device may reproduce an input image on a screen of a display panel where a plastic OLED is formed. The plastic OLED is formed on a flexible plastic substrate. The flexible display device may be implemented in various designs and have advantages in portability and durability. The flexible display device may be implemented as display devices of various types, such as a bendable display device, a foldable display device, and a rollable display device. The flexible display device may be applied to not only mobile devices such as smart phones and tablet PCs, but also televisions, automobile display devices, and wearable devices. The flexible display devices have grown in popularity.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of minimizing a radius of a rotation shaft.

Embodiments also provides a rollable display device capable of minimizing a radius of a rotation shaft.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment for achieving the above purpose includes a display panel; a chip on film attached to an end of the display panel; a printed circuit board electrically connected to an end of the chip on film and including a connector portion; a rotation shaft including the printed circuit board and extending in a direction; and a flexible cable having an end electrically connected to the connector portion of the printed circuit board. The connector portion of the printed circuit board may not overlap the display panel in a plan view.

The display panel may be rolled around or unrolled from an outer circumferential face of the rotation shaft.

The rotation shaft may have a cut groove defined in the outer circumferential face of the rotation shaft, and the display panel may be rolled or unrolled through the cut groove.

The rotation shaft may rotate in a direction, and the display panel may be rolled or unrolled under the rotation of the rotation shaft.

The rotation shaft may include a first end; and a second end opposite to the first end, and the connector portion may protrude outwardly beyond one of the first end and the second end.

The connector portion of the printed circuit board may include two connector portions, and the two connector portions may include a first connector portion; and a second connector portion.

The first connector portion may protrude outwardly beyond the first end, and the second connector portion may protrude outwardly beyond the second end.

Each of the first connector portion and the second connector portion may include at least one connector, and a number of the at least one connector of the first connector portion and a number of the at least one connector of the second connector portion may be different from each other.

The display panel may include banks disposed on a substrate and spaced apart from each other; a first electrode and a second electrode respectively disposed on and covering the banks, the first electrode and the second electrode being spaced apart from each other; a light-emitting element disposed between the first electrode and the second electrode; a first contact electrode electrically connected to the first electrode and in contact with an end of the light-emitting element; and a second contact electrode electrically connected to the second electrode and in contact with another end of the light-emitting element.

The display panel may further include a first element insulating layer disposed between the first electrode and the light-emitting element and between the second electrode and the light-emitting element; and a second element insulating layer disposed on a top face of the light-emitting element. The first contact electrode may be in direct contact with a side of a top face of the second element insulating layer, the second contact electrode may be in direct contact with another side of the top face of the second element insulating layer, the side of the top face being opposite to the another side of the top face, and the first contact electrode and the second contact electrode may expose a central portion of the top face of the second element insulating layer.

The display panel may further include a third element insulating layer integrally covers and contacts the first contact electrode and the second contact electrode.

A display device according to another embodiment for achieving the above purpose includes a display panel; a chip on film attached to an end of the display panel; a printed circuit board electrically connected to an end of the chip on film and including a connector portion; a rotation shaft including the printed circuit board and extending in a direction; and a flexible cable having an end electrically connected to the printed circuit board. The printed circuit board may include an overlapping portion overlapping the rotation shaft in a plan view, and a first protrusion protruding outwardly beyond a first end of the rotation shaft. The first protrusion may include a first connector portion. The first connector portion of the printed circuit board may not overlap the display panel in a plan view.

The display panel may be rolled around or unrolled from an outer circumferential face of the rotation shaft.

The rotation shaft may have a cut groove defined in the outer circumferential face of the rotation shaft, and the display panel may be rolled or unrolled through the cut groove.

The rotation shaft may rotate in a direction, and the display panel may be rolled or unrolled under the rotation of the rotation shaft.

The printed circuit board may further include a second protrusion protruding outwardly beyond a second end opposite to the first end of the rotation shaft.

The second protrusion may include a second connector portion, and each of the first connector portion and the second connector portion may include at least one connector.

A dimension in a direction perpendicular to said one direction of the overlapping portion may be smaller than a dimension in the direction perpendicular to said one direction of the first protrusion.

The first connector portion may protrude outwardly beyond the first end, and the second connector portion may protrude outwardly beyond the second end.

The display panel may include banks disposed on a substrate and spaced apart from each other; a first electrode and a second electrode respectively disposed on and covering the banks, the first electrode and the second electrode being spaced apart from each other; and a light-emitting element disposed between the first electrode and the second electrode.

Specific details of other embodiments are included in the detailed description and drawings.

According to embodiments of the disclosure, the radius of the rotation shaft may be minimized.

Effects according to the embodiments are not limited to that as described above, and further various effects are included herein.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTIONS OF THE EMBODIMENTS

Figure 1:
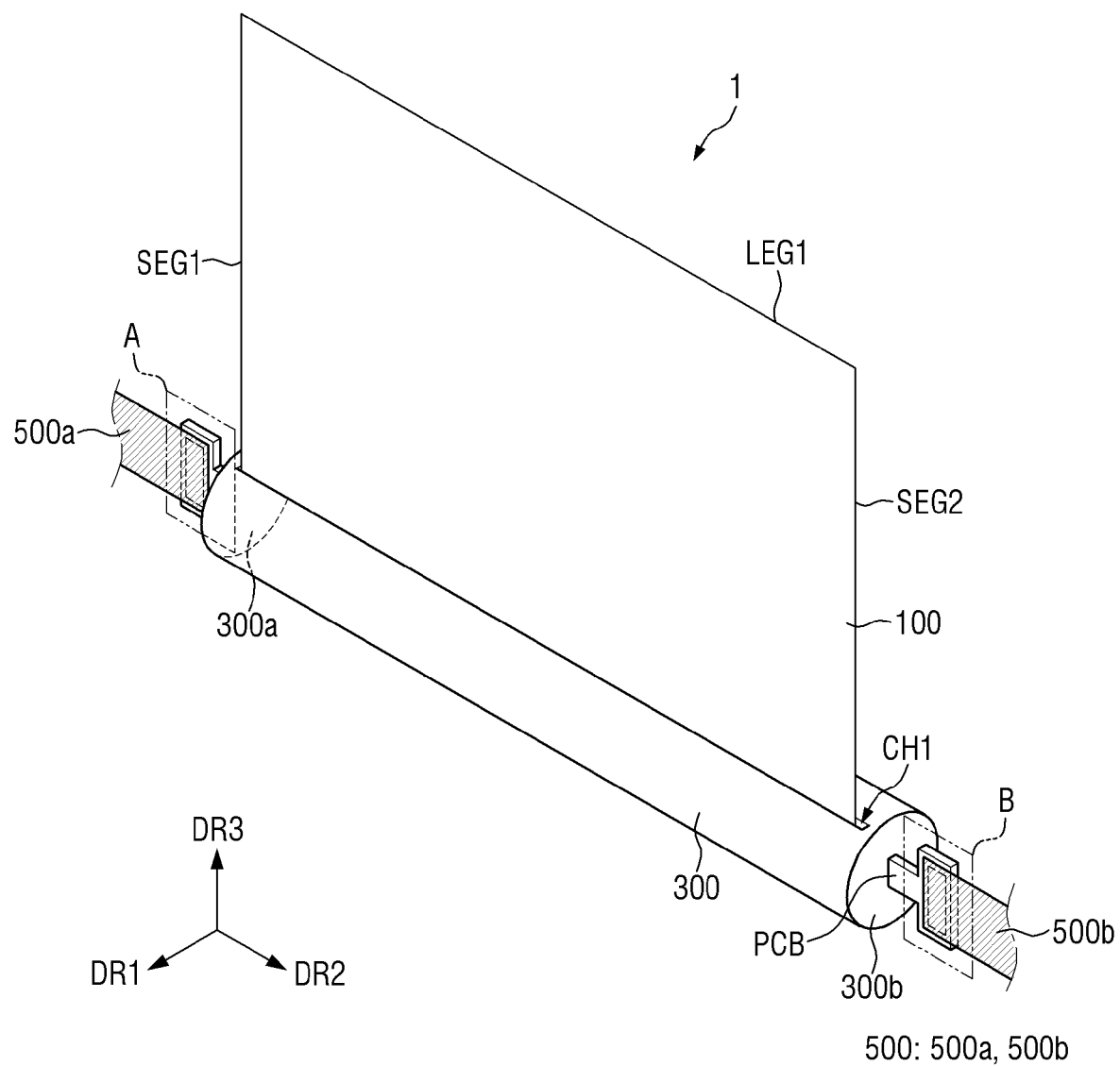
FIG. 1 is a schematic perspective view of a display device according to an embodiment.

In the following description, for the purposes of explanation, numerous specific details are set forth in order to provide a thorough understanding of various embodiments of implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangement. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Also, like reference numerals denote like elements. Further, in the accompanying drawings, the size and relative sizes of elements may be exaggerated for clarity and/or descriptive purposes.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprise," "comprising," "include," and "including," when used in this specification, specify the presence of the stated features, integers, operations, elements, components, and/or groups thereof, but do not preclude the presence or addition of one or more other features, integers, steps, operations, elements, components, groups, and/or portions thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. As used herein, the term "and/or" includes any and all combinations of one or more of the associated listed items. The phrase "at least one of" is intended to include the meaning of "at least one selected from the group of" for the purpose of its meaning and interpretation. For example, "at least one of A and B" may be understood to mean "A, B, or A and B.". When referring to "C to D", this means C inclusive to D inclusive unless otherwise specified.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Although the terms "first," "second," "third," and so on may be used herein to describe various types of elements, these elements should not be limited by these terms. These terms are used to distinguish one element from another element. Thus, a first element described below could be termed a second element without departing from the teachings of the disclosure.

When an element, such as a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

In an example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

For example, in descriptions of temporal relationships, temporal precedent relationships between two events such as "after", "subsequent to", "before", etc., another event may occur therebetween unless "directly after", "directly subsequent" or "directly before" is not indicated. The features of the various embodiments of the disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," "higher," "side" (e.g., as in "sidewall"), and the like, may be used herein for descriptive purposes, and thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" or "under" other elements or features would then be oriented "above" the other elements or features. Thus, the example terms "below" and "under" may encompass both an orientation of above and below. Furthermore, the apparatus may be otherwise oriented (e.g., rotated 90 degrees or at other orientations), and, as such, the spatially relative descriptors used herein should be interpreted accordingly.

Terms as used herein "first direction DR1", "second direction DR2", and "third direction DR3" should not be interpreted only to have a geometric relationship in which the first direction, the second direction, and the third direction are perpendicular to each other. The "first direction DR1", "second direction DR2", and "third direction DR3" may be interpreted to have a broader direction within a range in which components herein may work functionally.

Figure 2:
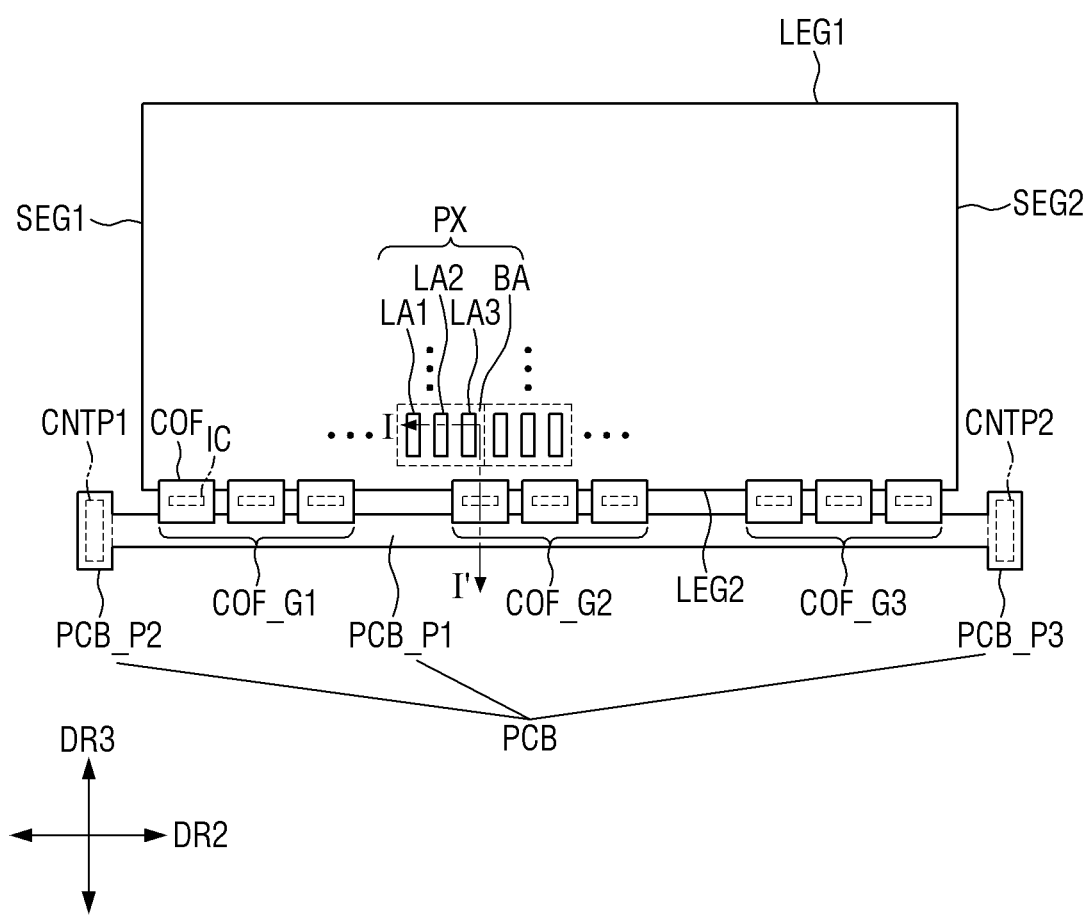
FIG. 2 is a schematic plan view showing a display panel, a chip on film, and a printed circuit board of the display device according to FIG. 1.
Figure 3:
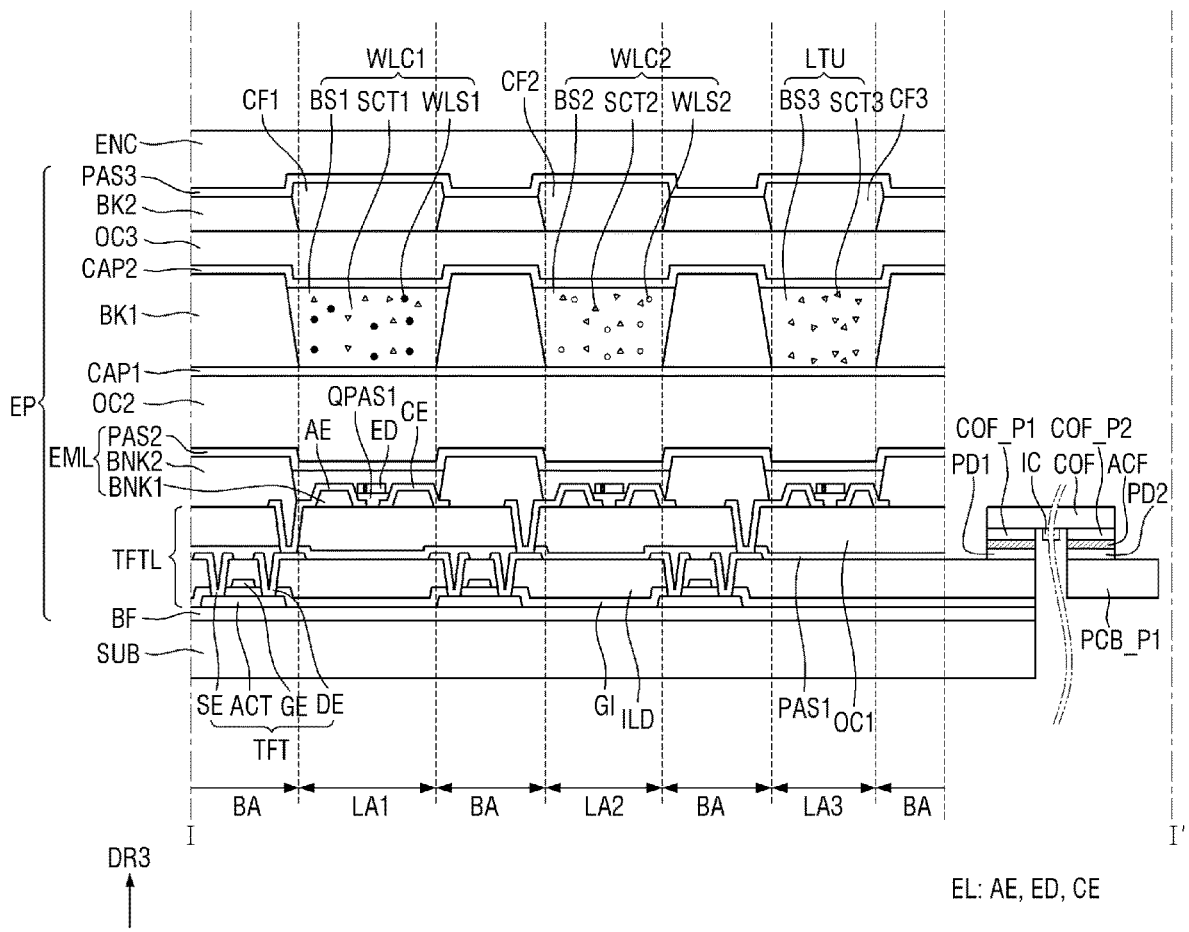
FIG. 3 is a schematic cross-sectional view taken along line I-I' in FIG. 2.

FIG. 1 is a schematic perspective view of a display device according to an embodiment. FIG. 2 is a schematic plan view showing a display panel, a chip on film, and a printed circuit board of the display device according to FIG. 1. FIG. 3 is a schematic cross-sectional view taken along line I-I' in FIG. 2.

Referring to FIGS. 1 to 3, a display device 1 according to an embodiment may include a display panel 100, a rotation shaft 300, and a flexible cable 500.

The display panel 100 may include long-side edges LEG1 and LEG2 extending in a second direction DR2, and short-side edges SEG1 and SEG2 extending in a third direction DR3. The second direction DR2 and the third direction DR3 may intersect each other.

The display panel 100 may include a liquid crystal display panel, an organic light-emitting diode display panel, an inorganic light-emitting diode display panel, or a quantum dot display panel. Hereinafter, for convenience of description, the display panel 100 is embodied as an inorganic light-emitting diode display panel.

The display panel 100 may have a flexibility, and thus may be readily and repeatedly wound, rolled around, unwound from, or unrolled from an outer circumferential face of the above-described rotation shaft 300.

The display panel 100 may include a face and another face that is opposite to the face. The face of the display panel 100 may be a display face. A stack structure of the display panel 100 is shown in FIG. 3.

As shown in FIG. 2, each of pixels PX of the display device 1 may include light-emitting areas LA1, LA2, and LA3 defined by a pixel defining layer, and a non-emitting area BA surrounding the light-emitting areas LA1, LA2, and LA3. Each of the pixels PX may emit light of a peak wavelength through the light-emitting areas LA1, LA2, and LA3. Each of the first to third light-emitting areas LA1, LA2, and LA3 may be an area in which light generated from a light-emitting element ED (e.g., refer to FIG. 3) of the display device 1 is emitted out of the display device 1.

The first to third light-emitting areas LA1, LA2, and LA3 may emit the light of the peak wavelength out of the display device 1. The first light-emitting area LA1 may emit light of a first color. The second light-emitting area LA2 may emit light of a second color. The third light-emitting area LA3 may emit light of a third color. For example, the light of the first color may be red light having a peak wavelength in a range of about 610 nm to about 650 nm. The light of the second color may be green light having a peak wavelength in a range of about 510 nm to about 550 nm. The light of the third color may be blue light with a peak wavelength ranging from about 440 nm to about 480 nm. However, the disclosure is not limited thereto.

As shown in FIG. 3, the display device 1 may include a substrate SUB, a display element layer EP on the substrate SUB, and an encapsulation member ENC that seals the display element layer EP.

The substrate SUB may be made of an insulating material such as polymer resin. The insulating material may include, for example, polyimide (PI), but is not limited thereto.

The display element layer EP may include a buffer layer BF, a thin-film transistor layer TFTL, a light-emitting element layer EML, a second planarization layer OC2, a first capping layer CAP1, a first light-blocking member BK1, a first wavelength converter WLC1, a second wavelength converter WLC2, a light transmitting part LTU, a second capping layer CAP2, a third planarization layer OC3, a second light-blocking member BK2, first to third color filters CF1, CF2, and CF3, a third passivation layer PAS3, and the encapsulation member ENC.

The buffer layer BF may be disposed on the substrate 100. The buffer layer BF may be composed of an inorganic film capable of preventing penetration of air or moisture.

The thin-film transistor layer TFTL may include a thin-film transistor TFT, a first pad PD1, a gate insulating film GI, an interlayer insulating film ILD, a first passivation layer PAS1, and a first planarization layer OC1.

A thin-film transistor TFT may be disposed on the buffer layer BF, and may constitute a pixel circuit of each of the pixels PX (e.g., refer to FIG. 2).

The semiconductor layer ACT may be disposed on the buffer layer BF. The semiconductor layer ACT may overlap a gate electrode GE, a source electrode SE, and a drain electrode DE in a plan view. The semiconductor layer ACT may be in direct contact with the source electrode SE and the drain electrode DE. The semiconductor layer ACT may face toward the gate electrode GE, and the gate insulating film GI may be interposed between the semiconductor layer ACCT and the gate electrode GE.

The gate electrode GE may be disposed on the gate insulating film GI. The gate electrode GE may overlap the semiconductor layer ACT in a plan view, and the gate insulating film GI may be interposed between the gate electrode GE and the semiconductor layer ACT.

The source electrode SE and the drain electrode DE may be disposed on the interlayer insulating film ILD and be spaced apart from each other. The source electrode SE may be in contact with an end of the semiconductor layer ACT via a contact hole defined in (or penetrating) the gate insulating film GI and the interlayer insulating film ILD. The drain electrode DE may contact another end of the semiconductor layer ACT via a contact hole defined in (or penetrating) the gate insulating film GI and the interlayer insulating film ILD. The drain electrode DE may be electrically connected to a first electrode AE of a light-emitting member EL via a contact hole defined in (or penetrating) the first passivation layer PAS1 and the first planarization layer OC1. The first pad PD1 may be disposed in a same layer in which the source electrode SE and the drain electrode DE are disposed.

The gate insulating film GI may be disposed on the semiconductor layer ACT. For example, the gate insulating film GI may be disposed on the semiconductor layer ACT and the buffer layer BF. The gate insulating film GI may insulate (e.g., electrically insulate) the semiconductor layer ACT and the gate electrode GE from each other. The gate insulating film GI may have a contact hole defined therein through which the source electrode SE extends and a contact hole defined therein through which the drain electrode DE extends.

The interlayer insulating film ILD may be disposed on the gate electrode GE. For example, the interlayer insulating film ILD may have a contact hole defined therein through which the source electrode SE extends and a contact hole defined therein through which the drain electrode DE extends.

The first passivation layer PAS1 may be disposed on the thin-film transistor TFT to protect the thin-film transistor TFT. For example, the first passivation layer PAS1 may have a contact hole defined therein through which the first electrode AE extends.

The first planarization layer OC1 may be disposed on the first passivation layer PAS1 to planarize a top of the thin-film transistor TFT. For example, the first planarization layer OC1 may have a contact hole defined therein through which the first electrode AE of the light-emitting member EL extends.

The light-emitting element layer EML may include the light-emitting member EL, a first bank BNK1, a second bank BNK2, a first element insulating layer QPAS1, and a second passivation layer PAS2.

The light-emitting member EL may be disposed on the thin-film transistor TFT. The light-emitting member EL may include the first electrode AE, a second electrode CE, and a light-emitting element ED.

The first electrode AE may be disposed on the first planarization layer OC1. For example, the first electrode AE may be disposed on a portion of the first bank BNK1 disposed on the first planarization layer OC1 to cover the first bank BNK1. The first electrode AE may be disposed to overlap one of the first to third light-emitting areas LA1, LA2, and LA3 in a plan view, which are defined by the second bank BNK2. The first electrode AE may be electrically connected to the drain electrode DE of the thin-film transistor TFT.

The second electrode CE may be disposed on the first planarization layer OC1. For example, the second electrode CE may be disposed on a portion of the first bank BNK1 disposed on the first planarization layer OC1 to cover the first bank BNK1. The second electrode CE may be disposed to overlap one of the first to third light-emitting areas LA1, LA2, and LA3 in a plan view, which are defined by the second bank BNK2. For example, the second electrode CE may receive a common voltage supplied to all pixels PX (e.g., refer to FIG. 2).

The first element insulating layer QPAS1 may cover a portion of the first electrode AE and a portion of the second electrode CE adjacent to each other, and may insulate (e.g., electrically insulate) the first electrode AE and the second electrode CE from each other.

The light-emitting element ED may be disposed on top of the first planarization layer OC1 and between the first electrode AE and the second electrode CE. The light-emitting element ED may be disposed on the first element insulating layer QPAS1. An end of the light-emitting element ED may be electrically connected to the first electrode AE, and another end of the light-emitting element ED may be electrically connected to the second electrode CE. For example, multiple light-emitting elements ED may respectively include active layers made of a same material to emit light of a same wavelength band or light of a same color. Light beams respectively emitting from the first to third light-emitting areas LA1, LA2, and LA3 may have the same color. For example, the light-emitting elements ED may emit light of the third color or blue light having a peak wavelength in a range of about 440 nm to about 480 nm.

The second bank BNK2 may be disposed on the first planarization layer OC1 to define each of the first to third light-emitting areas LA1, LA2, and LA3. For example, the second bank BNK2 may surround each of the first to third light-emitting areas LA1, LA2, and LA3. However, the disclosure is not limited thereto. The second bank BNK2 may be disposed in the light blocking area BA.

The second passivation layer PAS2 may be disposed on the light-emitting members EL and the second bank BNK2. The second passivation layer PAS2 may cover the light-emitting members EL and may protect the light-emitting members EL.

The display device 1 may further include the second planarization layer OC2, the first capping layer CAP1, the first light-blocking member BK1, the first wavelength converter WLC1, the second wavelength converter WLC2, the light transmitting part LTU, the second capping layer CAP2, the third planarization layer OC3, the second light-blocking member BK2, the first to third color filters CF1, CF2, and CF3, the third passivation layer PAS3, and the encapsulation member ENC.

The second planarization layer OC2 may be disposed on the light-emitting element layer EML to planarize a top of the light-emitting element layer EML. The second planarization layer OC2 may include an organic material.

The first capping layer CAP1 may be disposed on the second planarization layer OC2. The first capping layer CAP1 may seal a bottom face of each of the first and second wavelength converters WLC1 and WLC2 and the light transmitting part LTU. The first capping layer CAP1 may include an inorganic material.

The first light-blocking member BK1 may be disposed in the light blocking area BA and on the first capping layer CAP1. The first light-blocking member BK1 may overlap the second bank BNK2 in a thickness direction (e.g., third direction DR3) of the display device 1 (e.g., refer to FIG. 1). The first light-blocking member BK1 may block transmission of light therethrough.

The first light-blocking member BK1 may include an organic light-blocking material and a liquid repellent component.

The first light-blocking member BK1 may include the liquid repellent component to divide the light emission area into the light-emitting areas LA1, LA2, and LA3 as respectively corresponding to the first and second wavelength converters WLC1 and WLC2 and the light transmitting part LTU.

The first wavelength converter WLC1 may be disposed in the first light-emitting area LA1 and on the first capping layer CAP1. The first wavelength converter WLC1 may be surrounded with the first light-blocking member BK1. The first wavelength converter WLC1 may include a first base resin BS1, first scattering parts SCT1, and a first wavelength shifter WLS1.

The first base resin BS1 may include a material with relatively high light transmittance. The first base resin BS1 may be made of a transparent organic material. For example, the first base resin BS1 may include at least one of organic materials such as epoxy resin, acrylic resin, cardo resin, and imide resin.

The first scattering parts SCT1 may have a refractive index different from that of the first base resin BS1, and may form an optical interface with the first base resin BS1.

The first wavelength shifter WLS1 may convert or shift a peak wavelength of incident light to a first peak wavelength.

For example, the first wavelength shifter WLS1 may convert blue light provided from the display device 1 into red light having a single peak wavelength in a range of about 610 nm to about 650 nm and emit the red light. The first wavelength shifter WLS1 may be a quantum dot, a quantum rod, or a phosphor. The quantum dot may be a particulate matter that emits a specific color as electrons transition from a conduction band to a valence band.

The light emitted from the first wavelength shifter WLS1 may have a FWHM (full width at half maximum) of a wavelength spectrum equal to or smaller than about 45 nm, or about 40 nm, or about 30 nm. Thus, gamut and reproducibility of a color displayed from the display device 1 may be further improved.

A portion of blue light provided from the light-emitting element layer EML may pass through the first wavelength converter WLC1, and the portion of blue light may not be converted to red light via the first wavelength shifter WLS1. However, the portion of the blue light provided from the light-emitting element layer EML and incident on the first color filter CF1, which is not converted to the red light via the first wavelength converter WLC1, may be blocked with the first color filter CF1. The red light into which the first wavelength converter WLC1 converts a portion of the blue light provided from the display device 1 may pass through the first color filter CF1 and may emit out of the device. Accordingly, the first light-emitting area LA1 may emit the red light.

The second wavelength converter WLC2 may be disposed in the second light-emitting area LA2 and on the first capping layer CAP1. The second wavelength converter WLC2 may be surrounded with the first light-blocking member BK1. The second wavelength converter WLC2 may include a second base resin BS2, second scattering parts SCT2, and a second wavelength shifter WLS2.

The second base resin BS2 may include a material with relatively high light transmittance. The second base resin BS2 may be made of a transparent organic material.

The second scattering parts SCT2 may have a refractive index different from that of the second base resin BS2, and may form an optical interface with the second base resin BS2. For example, the second scattering parts SCT2 may include a light scattering material or light scattering particles that scatter at least a portion of light transmitting therethrough.

The second wavelength shifter WLS2 may convert or shift a peak wavelength of incident light to a second peak wavelength different from the first peak wavelength of the first wavelength shifter WLS1. For example, the second wavelength shifter WLS2 may convert blue light provided from the display device 1 into the green light having a single peak wavelength in a range of about 510 nm to about 550 nm and emit the green light. The second wavelength shifter WLS2 may be a quantum dot, a quantum rod, or a phosphor. The second wavelength shifter WLS2 may include a material having the same technical idea of the material exemplified with reference to the first wavelength shifter WLS1.

The light transmitting part LTU may be disposed in the third light-emitting area LA3 and on the first capping layer CAP1. The light transmitting part LTU may be surrounded with the first light-blocking member BK1. The light transmitting part LTU may transmit the incident light therethrough and maintain a peak wavelength thereof. The light transmitting part LTU may include a third base resin BS3 and third scattering parts SCT3.

The third base resin BS3 may include a material with relatively high light transmittance. The third base resin BS3 may be made of a transparent organic material.

The third scattering parts SCT3 may have a refractive index different from that of the third base resin BS3, and may form an optical interface with the third base resin BS3. For example, the third scattering parts SCT3 may include a light scattering material or light scattering particles that scatter at least a portion of light transmitting therethrough.

The first and second wavelength converters WLC1 and WLC2 and the light transmitting part LTU may be disposed on top of the light-emitting element layer EML, and the second planarization layer OC2 and the first capping layer CAP1 may be interposed therebetween. Thus, the display device 1 may be free of a separate substrate for the first and second wavelength converters WLC1 and WLC2 and the light transmitting part LTU. For example, the separate substrate for the first and second wavelength converters WLC1 and WLC2 and the light transmitting part LTU may be omitted.

The second capping layer CAP2 may cover the first and second wavelength converters WLC1 and WLC2, the light transmitting part LTU, and the first light-blocking member BK1.

The third planarization layer OC3 may be disposed on a top face of the second capping layer CAP2 to planarize a top of each of the first and second wavelength converters WLC1 and WLC2 and the light transmitting part LTU. The third planarization layer OC3 may include an organic material.

The second light-blocking member BK2 may be disposed in the light blocking area BA and on the third planarization layer OC3. The second light-blocking member BK2 may overlap the first light-blocking member BK1 or the second bank BNK2 in the thickness direction (e.g., third direction DR3). The second light-blocking member BK2 may block transmission of light therethrough.

The first color filter CF1 may be disposed in the first light-emitting area LA1 and on the third planarization layer OC3. The first color filter CF1 may be surrounded with the second light-blocking member BK2. The first color filter CF1 may overlap the first wavelength converter WLC1 in the thickness direction (e.g., third direction DR3). The first color filter CF1 may selectively transmit light of the first color (e.g., red light) therethrough and may block or absorb light of the second color (e.g., green light) and the third color (e.g., blue light).

The second color filter CF2 may be disposed in the second light-emitting area LA2 and on the third planarization layer OC3. The second color filter CF2 may be surrounded with the second light-blocking member BK2. The second color filter CF2 may overlap the second wavelength converter WLC2 in the thickness direction (e.g., third direction DR3). The second color filter CF2 may selectively transmit light of the second color (e.g., green light) therethrough, and may block or absorb light of the first color (e.g., red light) and light of the third color (e.g., blue light).

The third color filter CF3 may be disposed in the third light-emitting area LA3 and on the third planarization layer OC3. The third color filter CF3 may be surrounded with the second light-blocking member BK2. The third color filter CF3 may overlap the light transmitting part LTU in the thickness direction (e.g., third direction DR3). The third color filter CF3 may selectively transmit light of the third color (e.g., blue light) therethrough, and may block or absorb light of the first color (e.g., red light) and light of the second color (e.g., green light).

Each of the first to third color filters CF1, CF2, and CF3 may absorb a portion of the light introduced from the outside of the display device 1 to reduce reflection of the external light. Accordingly, the first to third color filters CF1, CF2, and CF3 may prevent color distortion due to external light reflection.

The third passivation layer PAS3 may cover the first to third color filters CF1, CF2, and CF3. The third passivation layer PAS3 may protect the first to third color filters CF1, CF2, and CF3.

The encapsulation member ENC may be disposed on the third passivation layer PAS3. For example, the encapsulation member ENC may include at least one inorganic film to prevent penetration of oxygen or moisture therein. Further, the encapsulation member ENC may include at least one organic film to protect the display device 1 from foreign substances such as dust.

Again, referring to FIGS. 1 and 2, the flexible cable 500 may include a first cable 500a disposed outwardly from an end 300a of the rotation shaft 300, and a second cable 500b disposed outwardly from another end 300b of the rotation shaft 300. The display device 1 according to an embodiment may further include chip on films COF connected to an end of the display panel 100. A driver integrated circuit (IC) IC may be disposed on each chip on film COF. For example, the driver integrated circuit IC may be provided in a form of a driver chip. The disclosure is not limited thereto.

The chip on films COF may constitute groups. For example, three chip on films COF may constitute a group. In FIG. 2, 9 chip on films COF are illustrated and thus, three groups COF_G1, COF_G2, and COF_G3 are illustrated. A printed circuit board PCB may be connected to ends of the chip on films COF constituting each of the groups COF_G1, COF_G2, and COF_G3.

As shown in FIG. 2, the printed circuit board PCB may include an overlapping portion PCB_P1, a first protrusion PCB_P2, and a third protrusion PCB_P3. The overlapping portion PCB_P1 may overlap the display panel 100. The first protrusion PCB_P2 may be connected to the overlapping portion PCB_P1 and located on a side in a direction opposite to the second direction DR2 of the overlapping portion PCB_P1. The second protrusion PCB_P3 may be connected to the overlapping portion PCB_P1 and located on a side in the second direction DR2 of the overlapping portion PCB_P1. Connector portions CNTP1 and CNTP2 may be respectively disposed on the protrusions PCB_P2 and PCB_P3. As will be described later, at least one or more connectors may be disposed in each of the connector portions CNTP1 and CNTP2. For example, the first connector portion CNTP1 may be disposed in the first protrusion PCB_P2, and the second connector portion CNTP2 may be disposed in the second protrusion PCB_P3.

The overlapping portion PCB_P1 may extend in the second direction DR2. The overlapping portion PCB_P1 may substantially overlap the display panel 100 in the third direction DR3. A portion of the overlapping portion PCB_P1 may protrude outwardly beyond each of the short-side edges SEG1 and SEG2 of the display panel 100.

A dimension in the third direction DR3 of the overlapping portion PCB_P1 may be smaller than a dimension in the third direction DR3 of each of the protrusions PCB_P2 and PCB_P3. This may secure a space in which the connectors disposed on the protrusions PCB_P2 and PCB_P3 as above-described are disposed.

Referring back to FIG. 3, the chip on film COF may be disposed on a first pad PD1. The chip on film COF may further include a first chip on pad COF_P1 connected to the first pad PD1, and a second chip on pad COF_P2 connected to a second pad PD2 of the printed circuit board PCB (e.g., overlapping portion PCB_P1 in FIG. 3). An anisotropic conductive film ACF may be interposed between the first pad PD1 and the first chip on pad COF_P1, and between the second pad PD2 and the second chip on pad COF_P2. For example, the anisotropic conductive film ACF may be interposed between the first pad PD1 and the first chip on pad COF_P1 and connect the first pad PD1 and the first chip on pad COF_P1 to each other. The anisotropic conductive film ACF may be interposed between the second pad PD1 and the second chip on pad COF_P2 and connect the second pad PD2 and the second chip on pad COF_P2 to each other.

Figure 4:
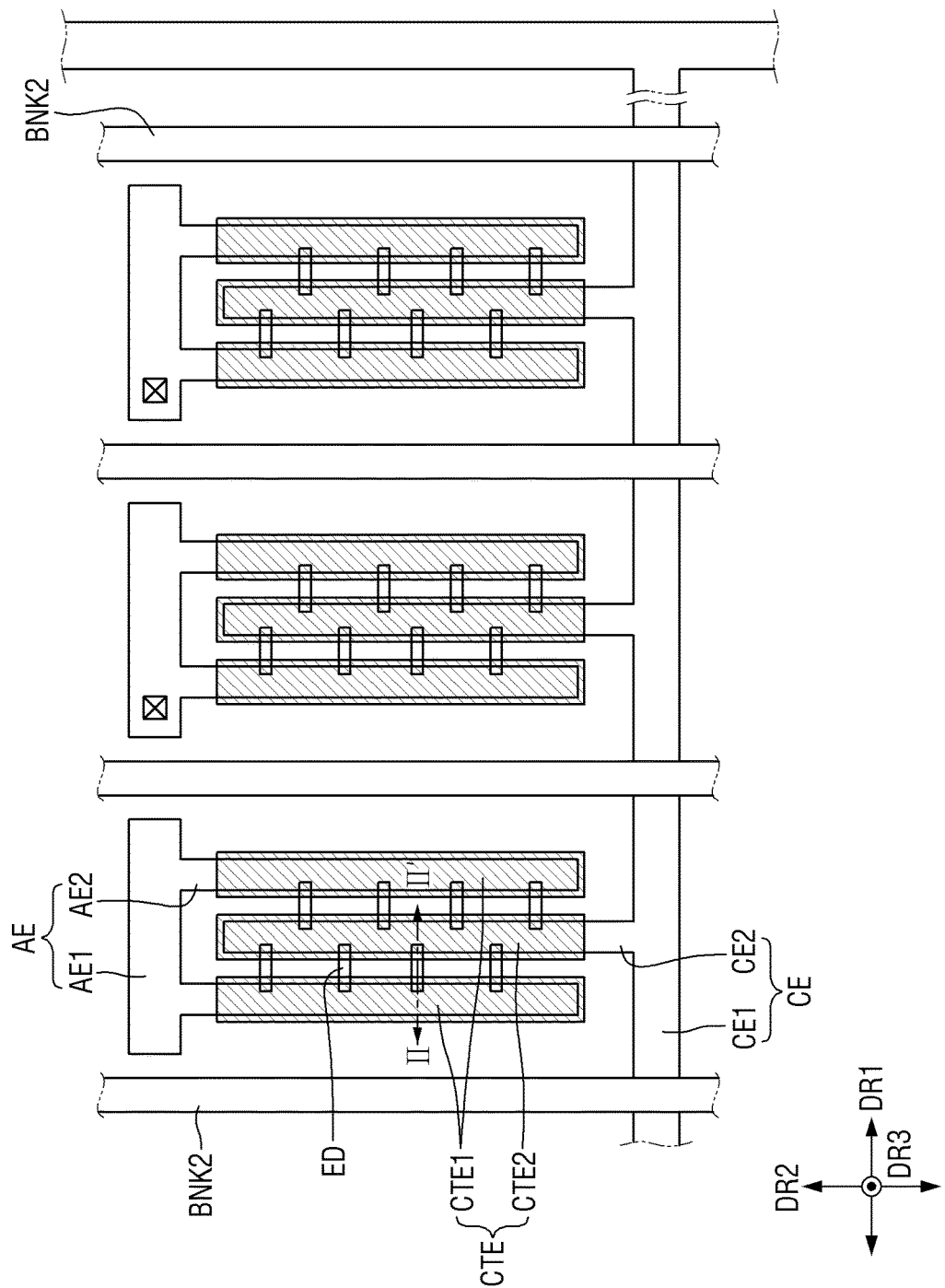
FIG. 4 is a schematic plan view showing a pixel of a display device according to an embodiment.
Figure 5:
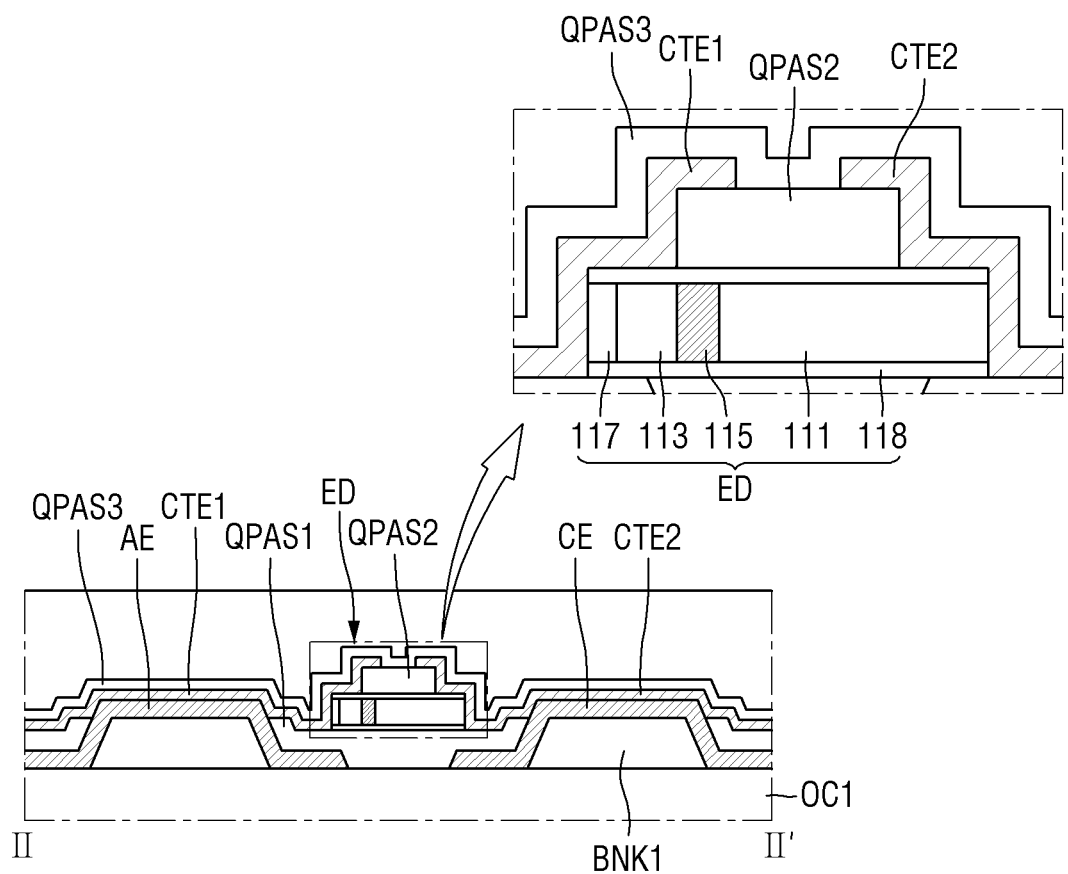
FIG. 5 is a schematic cross-sectional view taken along line II-II' in FIG. 4.

FIG. 4 is a schematic plan view showing a pixel of a display device according to an embodiment. FIG. 5 is a schematic cross-sectional view taken along line II-II' in FIG. 4.

Referring to FIG. 4 and FIG. 5 together with FIG. 2, each of the pixels PX may include first to third sub-pixels. Each of the first to third sub-pixels may correspond to each of the first to third light-emitting areas LA1, LA2, and LA3. The light-emitting element ED of each of the first to third sub-pixels may emit light via each of the first to third light-emitting areas LA1, LA2, and LA3.

The first to third sub-pixels may emit light of a same color. For example, the first to third sub-pixels may respectively include the light-emitting elements ED of a same type. The first to third sub-pixels may emit light of the third color or blue light. In another example, the first sub-pixel may emit light of the first color or red light, the second sub-pixel may emit light of the second color or green light, and the third sub-pixel may emit light of the third color or blue color.

Each of the first to third sub-pixels may include the first and second electrodes AE and CE, the light-emitting element ED, contact electrodes CTE, and second banks BNK2.

The first and second electrodes AE and CE may be electrically connected to the light-emitting element ED. A voltage may be applied to the first and second electrodes AE and CE, and the light-emitting element ED may emit light in a wavelength band. At least portions of the first and second electrodes AE and CE may generate an electric field in the pixel, and the light-emitting elements ED may be oriented under the electric field.

For example, the first electrode AE may be a pixel electrode. The pixel electrodes may respectively correspond to the first to third sub-pixels, and may be separated from each other. The second electrode CE may be a common electrode commonly connected to the first to third sub-pixels. One of the first electrode AE and the second electrode CE may act as an anode electrode of the light-emitting element ED, and another one thereof may act as a cathode electrode of the light-emitting element ED.

The first electrode AE may include a first electrode stem AE1 and at least one first electrode branch AE2. The first electrode stem AE1 may extend in the first direction DR1. The at least one first electrode branch AE2 may branch from the first electrode stem AE1 and extend in the second direction DR2.

The first electrode stem AE1 of each of the first to third sub-pixels may be spaced apart from the first electrode stem AE1 of an adjacent sub-pixel thereto. The first electrode stem AE1 of each of the first to third sub-pixels may be disposed at an imaginary extension line from the first electrode stem AE1 of a sub-pixel adjacent thereto in the first direction DR1. The first electrode stems AE1 of the first to third sub-pixels may receive different signals and may operate independently.

The first electrode branch AE2 may branch from the first electrode stem AE1 and extend in the second direction DR2. An end of the first electrode branch AE2 may be electrically connected to the first electrode stem AE1, and another end of the first electrode branch AE2 may be spaced apart from a second electrode stem CE1 opposite to the first electrode stem AE1.

The second electrode CE may include the second electrode stem CE1 and a second electrode branch CE2. The second electrode stem CE1 may extend in the first direction DR1. The second electrode branch CE2 may branch from the second electrode stem CE1 and extend in the second direction DR2. The second electrode stem CE1 of each of the first to third sub-pixels may be electrically connected to the second electrode stem CE1 of an adjacent sub-pixel thereto. The second electrode stem CE1 may extend in the first direction DR1 and may extend across the pixels. The second electrode stem CE1 may be electrically connected to a portion (e.g., portion of electrode or line) extending in a direction from a portion out of a display area or a non-display area.

The second electrode branch CE2 may be spaced apart from the first electrode branch AE2 and face toward the first electrode branch AE2. An end of the second electrode branch CE2 may be electrically connected to the second electrode stem CE1, and another end of the second electrode branch CE2 may be spaced apart from the first electrode stem AE1.

The first electrode AE may be electrically connected to the thin-film transistor layer TFTL of the display device via a first contact hole. The second electrode CE may be electrically connected to the thin-film transistor layer TFTL of the display device via a second contact hole. For example, the first contact hole may be disposed in each of the first electrode stems AE1, and the second contact hole may be disposed in the second electrode stem CE1. However, the disclosure is not limited thereto.

The second bank BNK2 may be disposed at a boundary between adjacent ones of the pixels PX. The first electrode stems AE1 may be spaced apart from each other via the second bank BNK2. The second bank BNK2 may extend in the second direction DR2, and may be disposed at a boundary between pixels PX (e.g., sub-pixels) arranged in the first direction DR1. The second bank BNK2 may be disposed at a boundary between pixels PX (e.g., sub-pixels) arranged in the second direction DR2. The second bank BNK2 may define boundaries of the pixels PX.

In case that ink in which the light-emitting elements ED are dispersed is ejected in a manufacturing process of the display device, the second bank BNK2 may prevent the ink from crossing the boundaries between the pixels PX. The second bank BNK2 may separate different inks in which different light-emitting elements ED are dispersed from each other, and the different inks may not be mixed with each other.

The light-emitting element ED may be disposed between the first electrode AE and the second electrode CE. An end of the light-emitting element ED may be electrically connected to the first electrode AE, and another end of the light-emitting element ED may be electrically connected to the second electrode CE.

The light-emitting elements ED may be spaced apart from each other and may be oriented so as to be substantially parallel to each other. A spacing between adjacent ones of the light-emitting elements ED may not be limited thereto.

The light-emitting elements ED may respectively include active layers made of a same material to emit light of the same wavelength and/or the same color. The first to third sub-pixels may emit light of the same color. For example, the light-emitting elements ED may emit light of the third color or blue light having a peak wavelength in a range of about 440 nm to about 480 nm.

The contact electrode CTE may include a first contact electrode CTE1 and a second contact electrode CTE2. The first contact electrode CTE1 may cover the first electrode branch AE2 and a portion of the light-emitting element ED, and may electrically connect the first electrode branch AE2 and the light-emitting element ED to each other. The second contact electrode CTE2 may cover the second electrode branch CE2 and another portion of the light-emitting element ED, and may electrically connect the second electrode branch CE2 and the light-emitting element ED to each other.

The first contact electrode CTE1 may be disposed on the first electrode branch AE2 and extend in the second direction DR2. The first contact electrode CTE1 may be in contact with an end of the light-emitting element ED. The light-emitting element ED may be electrically connected to the first electrode AE via the first contact electrode CTE1.

The second contact electrode CTE2 may be disposed on the second electrode branch CE2 and extend in the second direction DR2. The second contact electrode CTE2 may be spaced apart from the first contact electrode CTE1 in the first direction DR1. The second contact electrode CTE2 may be in contact with another end of the light-emitting element ED. The light-emitting element ED may be electrically connected to the second electrode CE via the second contact electrode CTE2.

The light-emitting element layer EML of the display device may be disposed on the thin-film transistor layer TFTL, and may include first to third element insulating layers QPAS1, QPAS2, and QPAS3.

Multiple first banks BNK1 may be disposed in each of the first to third light-emitting areas LA1, LA2, and LA3. Each of the first bank BNK1 may correspond to the first electrode AE or the second electrode CE. Each of the first and second electrodes AE and CE may be disposed on a corresponding first bank BNK1. For example, the first banks BNK1 may be disposed on the first planarization layer OC1, and a side face of each of the first banks BNK1 may be inclined relative to the first planarization layer OC1. The inclined side face of the first bank BNK1 may reflect the light emitting from the light-emitting element ED.

The first electrode stem AE1 may receive therein (or have) the first contact hole extending through the first planarization layer OC1. The first electrode stem AE1 may be electrically connected to the thin-film transistor TFT via the first contact hole.

The second electrode stem CE1 may extend in the first direction DR1 and may be disposed in the non-light-emitting area where the light-emitting element ED is not disposed. The second electrode stem CE1 may receive therein (or have) the second contact hole extending through the first planarization layer OC1. The second electrode stem CE1 may be electrically connected to a power electrode via the second contact hole. The second electrode CE may receive an electrical signal from the power electrode.

The first and second electrodes AE and CE may include a transparent conductive material. The first and second electrodes AE and CE may include a conductive material with high reflectivity. Each of the first and second electrodes AE and CE may have a structure in which at least one layer made of a transparent conductive material and at least one layer made of a metal having high reflectivity are stacked, or may be embodied as one layer including both the transparent conductive material and the metal having high reflectivity.

The first element insulating layer QPAS1 may be disposed on the first planarization layer OC1, the first electrode AE, and the second electrode CE. The first element insulating layer QPAS1 may cover a portion of each of the first and second electrodes AE and CE.

The first element insulating layer QPAS1 may protect the first and second electrodes AE and CE, and may mutually insulate (e.g., electrically insulate) the first and second electrodes AE and CE from each other. The first element insulating layer QPAS1 may prevent the light-emitting element ED from being damaged due to direct contact with other members. For example, the first element insulating layer QPAS1 may prevent electrical short circuit of the light-emitting element ED and other members.

The light-emitting element ED may be disposed on the first element insulating layer QPAS1 and between the first electrode AE and the second electrode CE. One end of the light-emitting element ED may be electrically connected to the first electrode AE, and the another end of the light-emitting element ED may be electrically connected to the second electrode CE.

The second element insulating layer QPAS2 may be disposed on a portion of the light-emitting element ED disposed between the first and second electrodes AE and CE. The second element insulating layer QPAS2 may be disposed in a central portion of a top face of the light-emitting element ED. The third insulating layer QPAS3 may partially surround an outer face of the light-emitting element ED. The third insulating layer QPAS3 may protect the light-emitting element ED. The third insulating layer QPAS3 may surround the outer face of the light-emitting element ED.

The contact electrode CTE may include the first and second contact electrodes CTE1 and CTE2. The first contact electrode CTE1 may cover the first electrode branch AE2 and a portion of the light-emitting element ED, and may electrically connect the first electrode branch AE2 and the light-emitting element ED to each other. The second contact electrode CTE2 may cover the second electrode branch CE2 and another portion of the light-emitting element ED, and may electrically connect the second electrode branch CE2 and the light-emitting element ED to each other.

The first contact electrode CTE1 may be disposed on the first electrode branch AE2 and extend in the second direction DR2. The first contact electrode CTE1 may be in contact with one end of the light-emitting element ED. The light-emitting element ED may be electrically connected to the first electrode AE via the first contact electrode CTE1.

The first contact electrode CTE1 may contact (e.g., directly contact) a top face and a side face of an end of the second element insulating layer QPAS2.

The second contact electrode CTE2 may be disposed on the second electrode branch CE2 and extend in the second direction DR2. The second contact electrode CTE2 may be spaced apart from the first contact electrode CTE1 in the first direction DR1. The second contact electrode CTE2 may be in contact with the another end of the light-emitting element ED. The light-emitting element ED may be electrically connected to the second electrode CE via the second contact electrode CTE2.

The second contact electrode CTE2 may contact (e.g., directly contact) a top face and a side face of another end of the second element insulating layer QPAS2.

The first contact electrode CTE1 and the second contact electrode CTE2 may be disposed in a same layer. The first contact electrode CTE1 and the second contact electrode CTE2 may expose a central portion of a top face of the second element insulating layer QPAS2.

Figure 6:
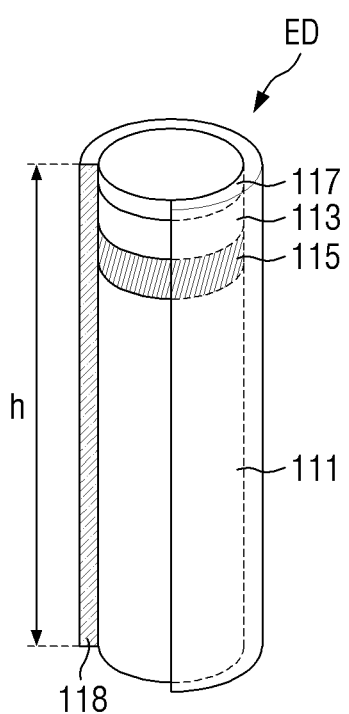
FIG. 6 is a schematic view showing a light-emitting element according to an embodiment.

FIG. 6 is a schematic view showing a light-emitting element according to an embodiment.

Referring to FIG. 6, the light-emitting element ED may be a light-emitting diode. For example, the light-emitting element ED may have a size of a micrometer or a nanometer, and may be an inorganic light-emitting diode including an inorganic material. The inorganic light-emitting diodes may be oriented under an electric field generated in a direction between two electrodes facing toward each other.

The light-emitting element ED may have a shape extending in a direction. The light-emitting element ED may have a shape of a rod, a wire, a tube, or the like. The light-emitting element ED may include a first semiconductor layer 111, a second semiconductor layer 113, an active layer 115, an electrode layer 117, and an insulating film 118.

The first semiconductor layer 111 may be (or include) an n-type semiconductor. The second semiconductor layer 113 may be disposed on the active layer 115. Each of the first and second semiconductor layers 111 and 113 may be composed of a single layer. However, the disclosure is not limited thereto.

The active layer 115 may be disposed between the first and second semiconductor layers 111 and 113. The active layer 115 may include a material of a single or multiple quantum well structure. In case that the active layer 115 includes a material having a multi-quantum well structure, quantum layers and well layers may be alternately stacked.

The light emitting from the active layer 115 may emit in a longitudinal direction of the light-emitting element ED, and may also emit toward sides (e.g., both sides) thereof. Directionality of the light emitting from the active layer 115 may not be limited. For example, the active layer 115 may emit the light in various directions.

The electrode layer 117 may be an ohmic contact electrode. In another example, the electrode layer 117 may be a Schottky contact electrode. The light-emitting element ED may include at least one electrode layer 117.

The insulating film 118 may surround outer faces of the semiconductor layers (e.g., first semiconductor layer 111, second semiconductor layer 113, active layer 115, or the like) and outer faces of the electrode layers (e.g., electrode layer 117). The insulating film 118 may surround an outer face of the active layer 115 and extend in a direction (e.g., longitudinal direction) in which the light-emitting element ED extends. The insulating film 118 may protect the light-emitting element ED.

The insulating film 118 may include a material with insulating properties, such as silicon oxide ($SiO_x$), silicon nitride ($SiN_x$), silicon oxynitride ($SiO_xN_y$), aluminum nitride (AlN), aluminum oxide ($Al_2O_3$), etc. However, the disclosure is not limited thereto.

An outer face of insulating film 118 may be surface-treated. The light-emitting elements ED may be sprayed onto the electrode (e.g., first and second electrodes AE and CE of FIG. 5), and dispersed in an ink during manufacturing of the display device. The light-emitting element ED may be oriented under the electrical field.

Figure 7:
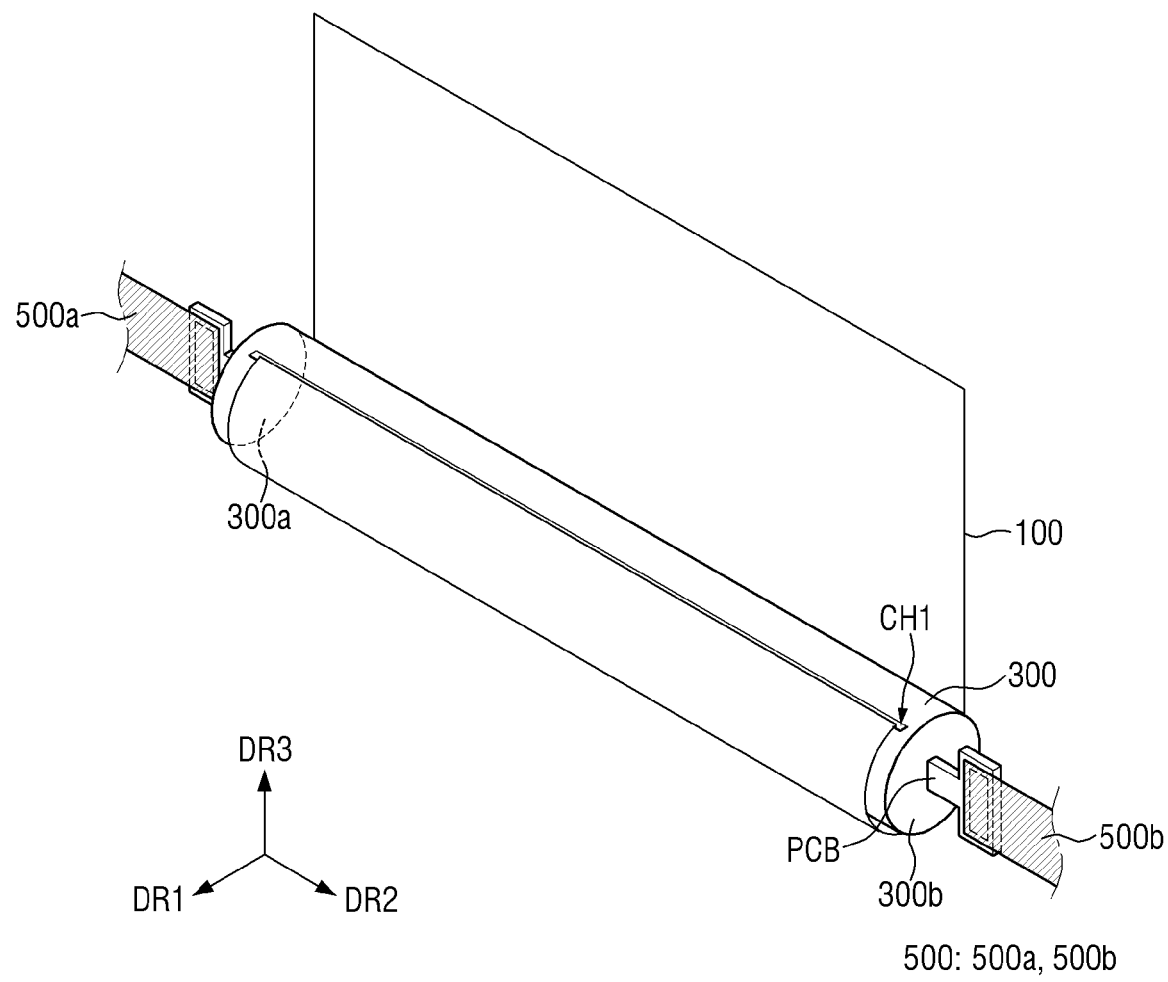
FIGS. 7 and 8 are schematic diagrams showing rolling/unrolling of the display panel of the display device according to FIG. 1.
Figure 8:
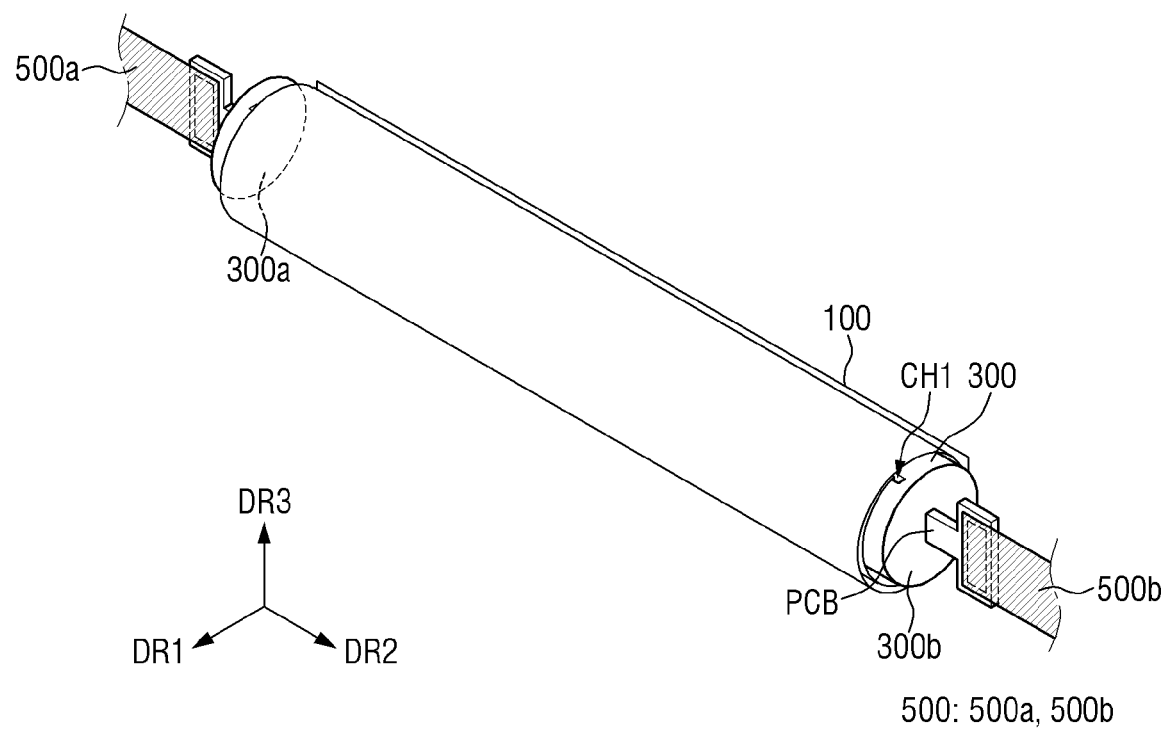

FIGS. 7 and 8 are schematic diagrams showing rolling/unrolling of the display panel of the display device according to FIG. 1.

Referring to FIGS. 7 and 8, the display panel 100 may be rolled around or unrolled from an outer circumferential face of the rotation shaft 300. In FIGS. 7 and 8, it is illustrated that the display panel 100 is rolled while the rotation shaft 300 rotates in a clockwise direction. However, the disclosure is not limited thereto. The display panel 100 may be rolled, and the rotation shaft 300 may rotate in a counterclockwise direction. Hereinafter, for convenience of description, the description will be based on a case in which the display panel 100 is rolled while the rotation shaft 300 rotates in the clockwise direction.

The display panel 100 is rolled and unrolled in the clockwise/counterclockwise direction rotation of the rotation shaft 300 because the printed circuit board MB connected to the display panel 100 via the chip on film COF is fixedly received inside (or in a hollow space defined in) the rotation shaft 300.

In an example, as described above, the display panel 100 may be rolled around or unrolled from the outer circumferential face of the rotation shaft 300. Although a separate groove is defined in (or penetrate) the outer circumferential face of the rotation shaft 300, it may be difficult to withdraw the above-described flexible cable 500 through the groove. Therefore, as in an embodiment, the flexible cable 500 may be drawn out through an end (e.g., an end and another end) of the rotation shaft 300. However, as a size of the display device 1 becomes larger, the number of required flexible cables 500 may increase. Thus, an overall size of the display device 1 including the rotation shaft 300 may increase.

However, as in an embodiment, ends of the groups COF_G1, COF_G2, and COF_G3 (e.g., refer to FIG. 2) of the chip on films COF (e.g., refer to FIG. 2) may be connected to a printed circuit board PCB, and the connector portions CNTP1 and CNTP2 (e.g., refer to FIG. 2) for electrically connecting the printed circuit board PCB respectively to the groups COF_G1, COF_G2, and COF_G3 of the chip on films COF may be respectively disposed in the protrusions PCB_P2 and PCB_P3 (e.g., refer to FIG. 2) of the printed circuit board PCB. Thus, the overall size of display device 1 including the rotation shaft 300 may be prevented from increasing. For example, the overall size of the display device 1 including the rotation shaft 300 may be decreased.

Figure 9:
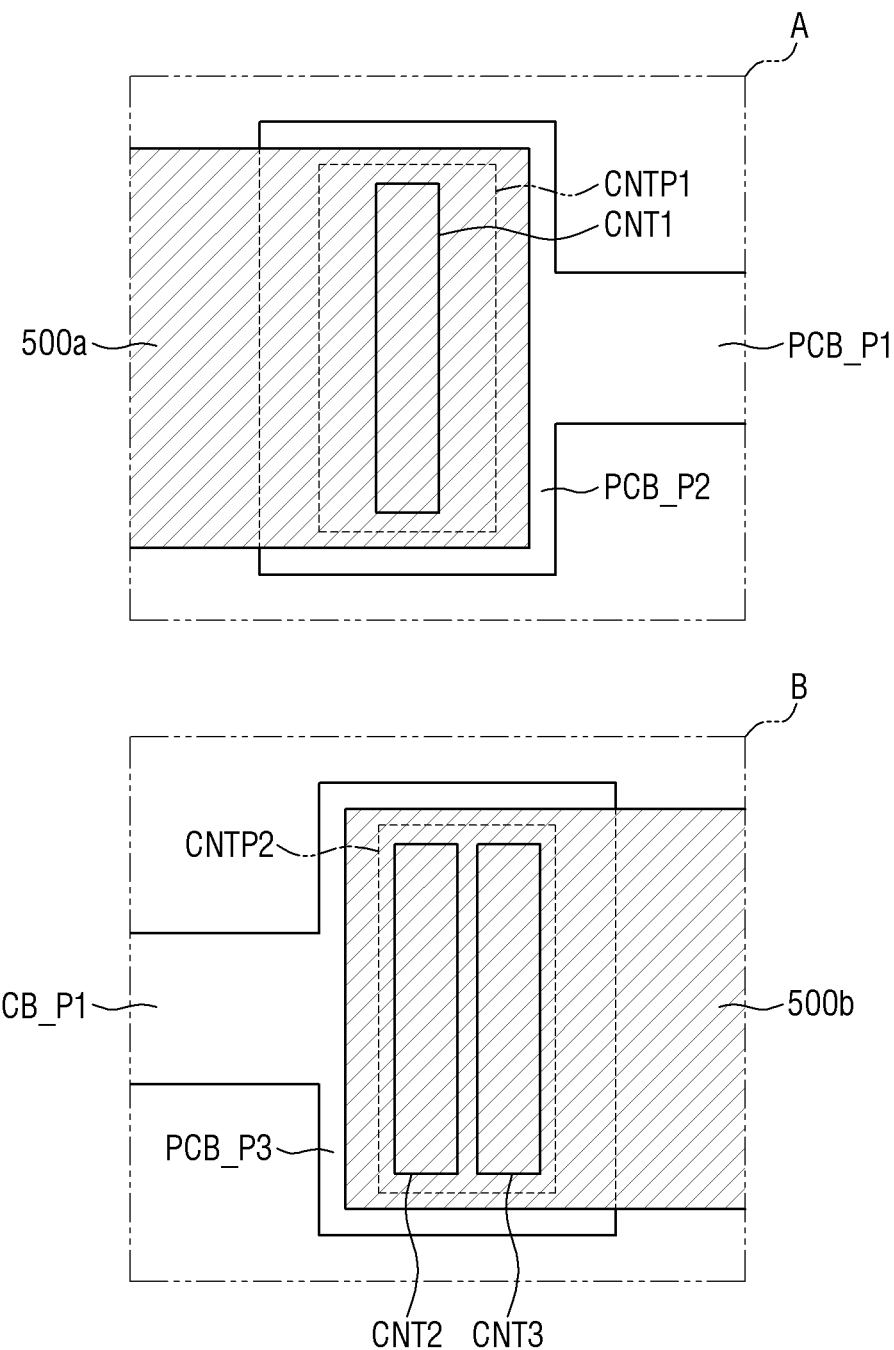
FIG. 9 is a schematic enlarged plan view of area A and area B of FIG. 1.

FIG. 9 is a schematic enlarged plan view of area A and area B of FIG. 1.

Referring to FIG. 9, a first connector CNT1 may be disposed in the first connector portion CNTP1 of the first protrusion PCT_P2. A second connector CNT2 and a third connector CNT3 may be disposed in the second connector portion CNTP2 of the second protrusion PCT_P3. For example, in an embodiment, the three groups COF_G1, COF_G2, and COF_G3 of the chip on films COF are illustrated by way of example. Thus, the number of connectors of the first connector portion CNTP1 and the number of connectors of the second connector portion CNTP2 may be different from each other.

However, unlike the example, the number of connectors of the first connector portion CNTP1 and the number of connectors of the second connector portion CNTP2 may be equal to each other based on the number of the groups of chip on films COF. In other embodiments, the number of connectors of the second connector portion CNTP2 may be larger than the number of connectors of the first connector portion CNTP1 based on the number of the groups of chip on films COF.

Hereinafter, another embodiment will be described.

Figure 10:
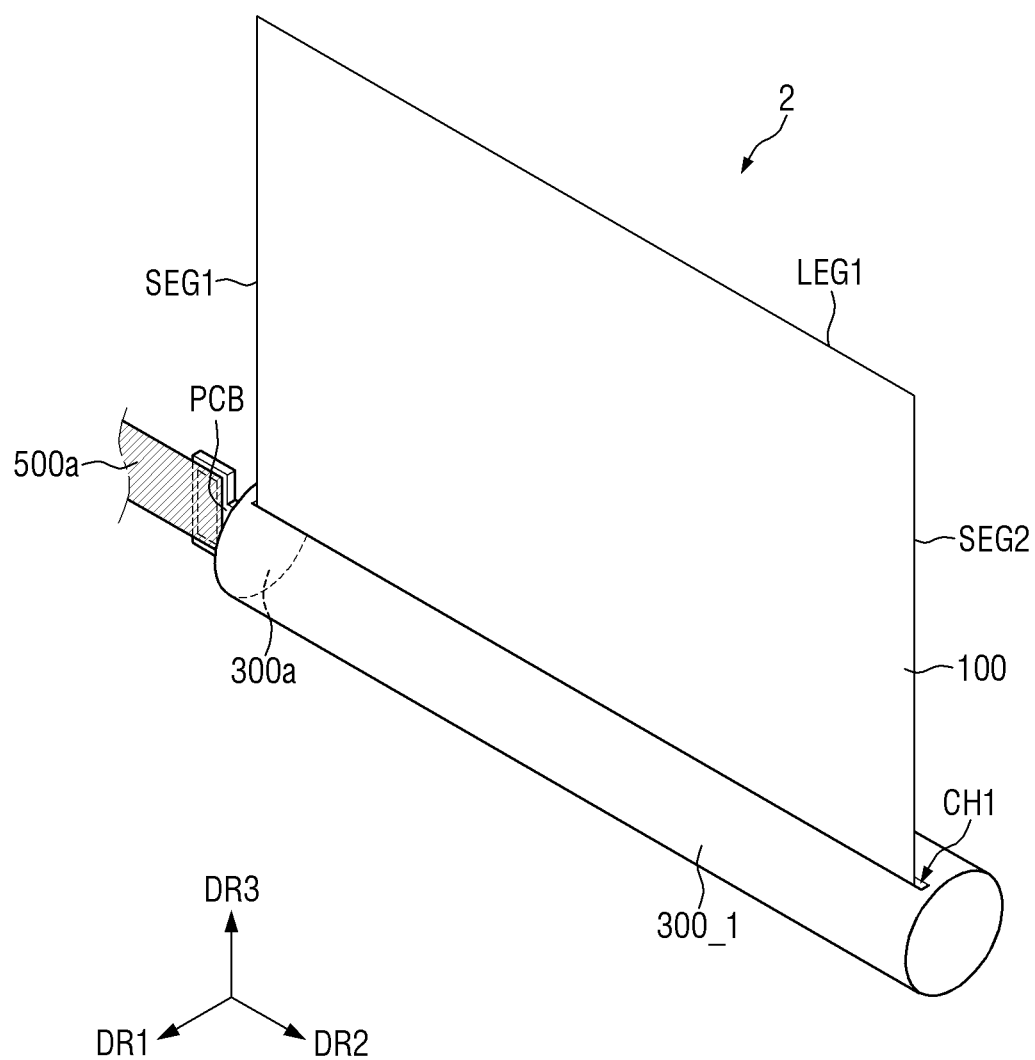
FIG. 10 is a schematic perspective view of a display device according to another embodiment.
Figure 11:
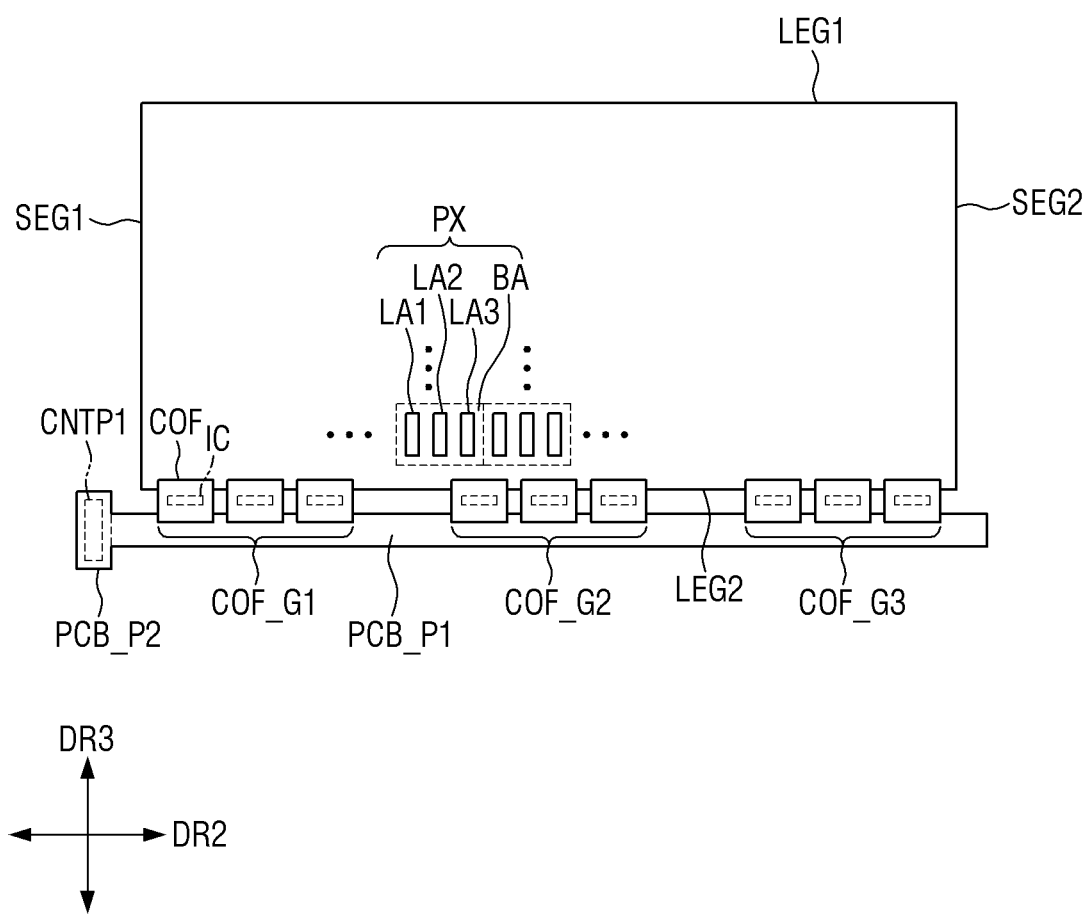
FIG. 11 is a schematic plan view showing a display panel, a chip on film, and a printed circuit board of the display device according to FIG. 10.
Figure 12:
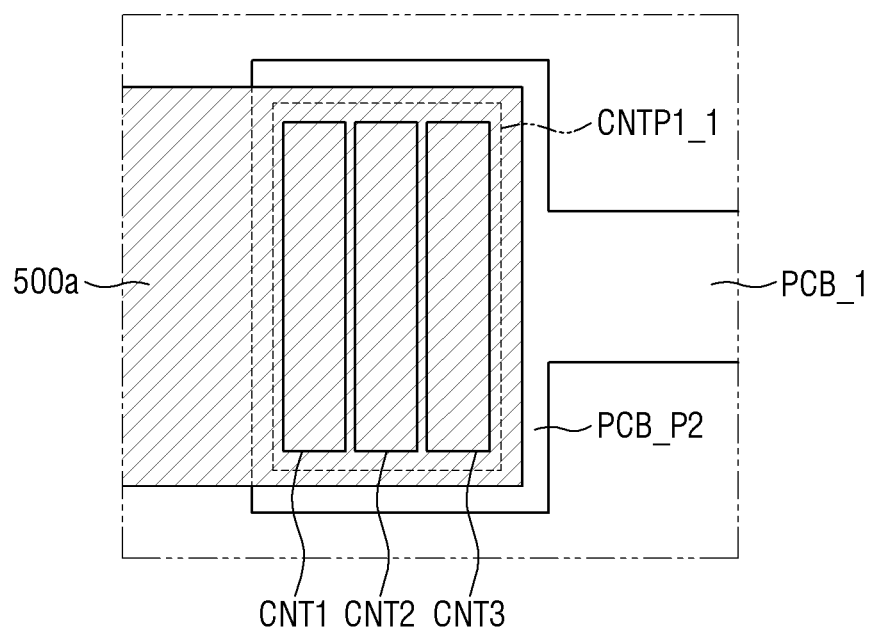
FIG. 12 is a schematic plan view showing an overlapping portion, a first protrusion, and a first flexible cable of FIG. 10.

FIG. 10 is a schematic perspective view of a display device according to another embodiment. FIG. 11 is a schematic plan view showing a display panel, a chip on film, and a printed circuit board of the display device according to FIG. 10. FIG. 12 is a schematic plan view showing an overlapping portion, a first protrusion, and a first flexible cable of FIG. 10.

Referring to FIGS. 10 to 12, a display device 2 according to the embodiment is different from the display device 1 according to FIGS. 1 and 2 in that the printed circuit board in the display device 2 does not include the second protrusion (e.g., PCB_P3 in FIG. 2).

For example, in the display device 2 according to the embodiment, the printed circuit board may not include the second protrusion (e.g., PCB_P3 in FIG. 2). Accordingly, the first connector portion CNTP1_1 of the first protrusion PCB_P2 may include three connectors CNT1, CNT2, and CNT3.

In FIGS. 10 to 12, the printed circuit board may not include the second protrusion. However, the disclosure is not limited thereto. The printed circuit board may include only the second protrusion, and not include the first protrusion.

The display panel 100 may be rolled around or unrolled around from an outer circumferential face of a rotation shaft 300_1. Although a separate groove is defined in (or penetrate) the outer circumferential face of the rotation shaft 300, it may be difficult to withdraw the above-described flexible cable 500a through the groove. Therefore, as in an embodiment, the flexible cable 500a may be drawn out through an end of the rotation shaft 300_1. However, in case that a size of the display device 2 increases, the number of required flexible cables 500a may increase. Thus, an overall size of the display device 1 including the rotation shaft 300_1 may increase.

However, as in this embodiment, ends of groups COF_G1, COF_G2, and COF_G3 of chip on films COF may be connected to a printed circuit board PCB, and a first connector portion CNTP1 for electrically connecting the printed circuit board PCB to the groups COF_G1, COF_G2, and COF_G3 of the chip on films COF may be disposed in the first protrusion PCB_P2 of the printed circuit board PCB. Thus, the overall size of display device 2 including the rotation shaft 300_1 may be prevented from increasing.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
a display panel;
a chip on film attached to an end of the display panel;
a printed circuit board that includes a connector portion, the printed circuit board being electrically connected to an end of the chip on film;
a rotation shaft including the printed circuit board and extending in a first direction; and
a flexible cable having an end electrically connected to the connector portion of the printed circuit board, wherein the display panel is rolled around or unrolled from an outer circumferential face of the rotation shaft, the connector portion of the printed circuit board does not overlap the display panel in a plan view when the display panel is rolled around the rotation shaft, and
a length of the printed circuit board in the first direction is longer than a length of the display panel in the first direction.

2. The device of claim 1, wherein
the rotation shaft has a cut groove defined in the outer circumferential face of the rotation shaft, and
the display panel is rolled or unrolled through the cut groove.

3. The device of claim 2, wherein
the rotation shaft rotates in a direction, and
the display panel is rolled or unrolled under the rotation of the rotation shaft.

4. The device of claim 3, wherein
the rotation shaft includes:
a first end; and
a second end opposite to the first end, and
the connector portion protrudes outwardly beyond one of the first end and the second end.

5. The device of claim 4, wherein
the connector portion of the printed circuit board includes two connector portions, and
the two connector portions include:
a first connector portion; and
a second connector portion.

6. The device of claim 5, wherein
the first connector portion protrudes outwardly beyond the first end, and
the second connector portion protrudes outwardly beyond the second end.

7. The device of claim 6, wherein
each of the first connector portion and the second connector portion includes at least one connector, and
a number of the at least one connector of the first connector portion and a number of the at least one connector of the second connector portion are different from each other.

8. The device of claim 1, wherein the display panel includes:
banks disposed on a substrate and spaced apart from each other;
a first electrode and a second electrode respectively disposed on and covering the banks, the first electrode and the second electrode being spaced apart from each other;
a light-emitting element disposed between the first electrode and the second electrode;
a first contact electrode electrically connected to the first electrode and in contact with an end of the light-emitting element; and
a second contact electrode electrically connected to the second electrode and in contact with another end of the light-emitting element.

9. A display device comprising:
a display panel;
a chip on film attached to an end of the display panel;
a printed circuit board electrically connected to an end of the chip on film and including a connector portion;
a rotation shaft including the printed circuit board and extending in a direction; and
a flexible cable having an end electrically connected to the connector portion of the printed circuit board,
wherein the connector portion of the printed circuit board does not overlap the display panel in a plan view,
wherein the display panel includes:
banks disposed on a substrate and spaced apart from each other;
a first electrode and a second electrode respectively disposed on and covering the banks, the first electrode and the second electrode being spaced apart from each other;
a light-emitting element disposed between the first electrode and the second electrode;
a first contact electrode electrically connected to the first electrode and in contact with an end of the light-emitting element; and
a second contact electrode electrically connected to the second electrode and in contact with another end of the light-emitting element,
a first element insulating layer disposed between the first electrode and the light-emitting element and between the second electrode and the light-emitting element; and
a second element insulating layer disposed on a top face of the light-emitting element,
wherein:
the first contact electrode is in direct contact with a side of a top face of the second element insulating layer,
the second contact electrode is in direct contact with another side of the top face of the second element insulating layer, the side of the top face being opposite to the another side of the top face, and
the first contact electrode and the second contact electrode expose a central portion of the top face of the second element insulating layer.

10. The device of claim 9, wherein the display panel further includes a third element insulating layer integrally covers and contacts the first contact electrode and the second contact electrode.

11. A display device comprising:
a display panel;
a chip on film attached to an end of the display panel;
a printed circuit board electrically connected to an end of the chip on film and including a connector portion;
a rotation shaft including the printed circuit board and extending in a first direction; and
a flexible cable having an end electrically connected to the printed circuit board, wherein
the printed circuit board includes:
an overlapping portion overlapping the rotation shaft in a plan view; and
a first protrusion protruding outwardly beyond a first end of the rotation shaft in the first direction,
the first protrusion includes a first connector portion,
the display panel is rolled around or unrolled from an outer circumferential face of the rotation shaft,
the first connector portion of the printed circuit board does not overlap the display panel in a plan view when the display panel is rolled around the rotation shaft, and
a length of the printed circuit board in the first direction is longer than a length of the display panel in the first direction.

12. The device of claim 11, wherein
the rotation shaft has a cut groove defined in the outer circumferential face of the rotation shaft, and
the display panel is rolled or unrolled through the cut groove.

13. The device of claim 12, wherein
the rotation shaft rotates in a direction, and
the display panel is rolled or unrolled under the rotation of the rotation shaft.

14. The device of claim 13, wherein the printed circuit board further includes a second protrusion protruding outwardly beyond a second end opposite to the first end of the rotation shaft.

15. The device of claim 14, wherein
the second protrusion includes a second connector portion, and
each of the first connector portion and the second connector portion includes at least one connector.

16. The device of claim 11, wherein a dimension in a direction perpendicular to said one direction of the overlapping portion is smaller than a dimension in the direction perpendicular to said one direction of the first protrusion.

17. The device of claim 15, wherein
the first connector portion protrudes outwardly beyond the first end, and
the second connector portion protrudes outwardly beyond the second end.

18. The device of claim 11, the display panel includes:
banks disposed on a substrate and spaced apart from each other;
a first electrode and a second electrode respectively disposed on and covering the banks, the first electrode and the second electrode being spaced apart from each other; and
a light-emitting element disposed between the first electrode and the second electrode.

* * * * *